(12) United States Patent
Ono

(10) Patent No.: US 11,251,057 B2
(45) Date of Patent: Feb. 15, 2022

(54) THERMAL PROCESSING METHOD AND THERMAL PROCESSING DEVICE

(71) Applicant: SCREEN Holdings Co., Ltd., Kyoto (JP)

(72) Inventor: Yukio Ono, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/960,923

(22) PCT Filed: Oct. 3, 2018

(86) PCT No.: PCT/JP2018/037010
§ 371 (c)(1),
(2) Date: Jul. 9, 2020

(87) PCT Pub. No.: WO2019/146166
PCT Pub. Date: Aug. 1, 2019

(65) Prior Publication Data
US 2020/0335366 A1  Oct. 22, 2020

(30) Foreign Application Priority Data
Jan. 26, 2018  (JP) .............................. JP2018-011269

(51) Int. Cl.
*H01L 21/67* (2006.01)
*H01L 21/268* (2006.01)
*H01L 21/324* (2006.01)

(52) U.S. Cl.
CPC .... *H01L 21/67115* (2013.01); *H01L 21/2686* (2013.01); *H01L 21/324* (2013.01)

(58) Field of Classification Search
CPC ........... H01L 21/67115; H01L 21/2686; H01L 21/324; H01L 21/6875; H01L 21/265; H01L 21/67109; H01L 21/67098
See application file for complete search history.

(56) References Cited

U.S. PATENT DOCUMENTS 6,391,690 B2 * 5/2002 Miyasaka ........... C23C 16/0209
257/E21.101
9,799,517 B2  10/2017 Tanimura et al.
(Continued)

FOREIGN PATENT DOCUMENTS

GB   2 317 497 A   3/1998
JP   H07-235507 A   9/1995
(Continued)

OTHER PUBLICATIONS

International Search Report dated Nov. 27, 2018 in corresponding PCT International Application No. PCT/JP2018/037010.
(Continued)

*Primary Examiner* — Mary A Wilczewski
(74) *Attorney, Agent, or Firm* — Ostrolenk Faber LLP

(57) ABSTRACT

Before a start of a treatment of a semiconductor wafer to be treated first in a lot, a dummy wafer is transported into a chamber, and an atmosphere including a helium gas having high thermal conductivity is formed. When the dummy wafer is heated with light irradiation from halogen lamps, heat transfer from the dummy wafer the temperature of which has increased occurs at an upper chamber window and a lower chamber window, with the helium gas as a heating medium. At the time when the semiconductor wafer to be treated first is transported into the chamber, the upper chamber window and the lower chamber window are heated, which makes a temperature history of all the semiconductor wafers in the lot uniform. It is thus possible to omit dummy running.

6 Claims, 8 Drawing Sheets

(56) References Cited

U.S. PATENT DOCUMENTS

| | | | |
|---|---|---|---|
| 10,559,482 B2* | 2/2020 | Ito | H01L 21/6875 |
| 2005/0102108 A1 | 5/2005 | Ramachandran et al. | |
| 2005/0115947 A1* | 6/2005 | Hosokawa | F27B 17/0025 |
| | | | 219/411 |
| 2006/0018639 A1 | 1/2006 | Ramamurthy et al. | |
| 2008/0090309 A1* | 4/2008 | Ranish | H01L 21/67115 |
| | | | 438/5 |
| 2009/0010626 A1 | 1/2009 | Ramamurthy et al. | |
| 2009/0274454 A1* | 11/2009 | Aderhold | H01L 21/67115 |
| | | | 392/416 |
| 2011/0123178 A1* | 5/2011 | Aderhold | H01L 21/324 |
| | | | 392/416 |
| 2011/0262115 A1* | 10/2011 | Yokouchi | H01L 21/324 |
| | | | 392/407 |
| 2013/0248504 A1* | 9/2013 | Kusuda | H01L 21/324 |
| | | | 219/121.85 |
| 2014/0003800 A1 | 1/2014 | Ramamurthy et al. | |
| 2014/0161429 A1 | 6/2014 | Yokouchi et al. | |
| 2014/0169772 A1* | 6/2014 | Abe | H05B 3/0047 |
| | | | 392/418 |
| 2016/0064219 A1 | 3/2016 | Yamamoto et al. | |
| 2016/0336195 A1* | 11/2016 | Fuse | H01L 21/324 |
| 2017/0011922 A1* | 1/2017 | Tanimura | H01L 21/324 |
| 2017/0011923 A1 | 1/2017 | Tanimura et al. | |
| 2017/0053818 A1* | 2/2017 | Aoyama | H01L 21/324 |
| 2017/0062249 A1* | 3/2017 | Aoyama | H01L 21/324 |
| 2017/0117152 A1* | 4/2017 | Aoyama | H01L 21/2253 |
| 2017/0125312 A1* | 5/2017 | Ono | H01L 21/67248 |
| 2017/0221715 A1* | 8/2017 | Tanimura | H01L 21/02667 |
| 2018/0240681 A1* | 8/2018 | Ono | H01J 37/32724 |
| 2018/0261477 A1* | 9/2018 | Ito | H01L 21/2253 |
| 2018/0337103 A1* | 11/2018 | Omori | H01L 21/67253 |
| 2018/0340832 A1* | 11/2018 | Hawrylchak | H01L 22/12 |
| 2019/0198331 A1* | 6/2019 | Sasaki | H01L 21/67115 |
| 2019/0228997 A1* | 7/2019 | Hu | G01J 5/34 |
| 2020/0075344 A1* | 3/2020 | Omori | H01L 21/324 |
| 2020/0335366 A1* | 10/2020 | Ono | H01L 21/2686 |

FOREIGN PATENT DOCUMENTS

| | | | | |
|---|---|---|---|---|
| JP | H09-156916 A | | 6/1997 | |
| JP | H09-162124 A | | 6/1997 | |
| JP | H10-107018 A | | 4/1998 | |
| JP | 2007-523466 A | | 8/2007 | |
| JP | 2010-225645 A | | 10/2010 | |
| JP | 2018-148178 A | | 9/2018 | |
| JP | 2019-129273 | * | 8/2019 | H01L 21/265 |
| KR | 10-2008-0102335 A | | 11/2008 | |
| KR | 10-2014-0076501 A | | 6/2014 | |
| TW | 201611159 A | | 3/2016 | |
| TW | 201705296 A | | 2/2017 | |
| WO | WO 97/22142 A1 | | 6/1997 | |
| WO | WO 2019/146166 | * | 8/2019 | H01L 21/265 |

OTHER PUBLICATIONS

Written Opinion dated Nov. 27, 2018 in corresponding PCT International Application No. PCT/JP2018/037010.

Office Action dated Aug. 12, 2019 in corresponding Taiwanese Patent Application No. 107138719, along with a partial English translation based on a Japanese translation.

Decision to Grant a Patent dated Oct. 5, 2021 in corresponding Japanese Patent Application No. 2018-011269.

Notification of Reason for Refusal dated Dec. 6, 2021 in corresponding Korean Patent Application No. 10-2020-7021697 and machine-generated English translation obtained from the JPO.

* cited by examiner

F I G. 8
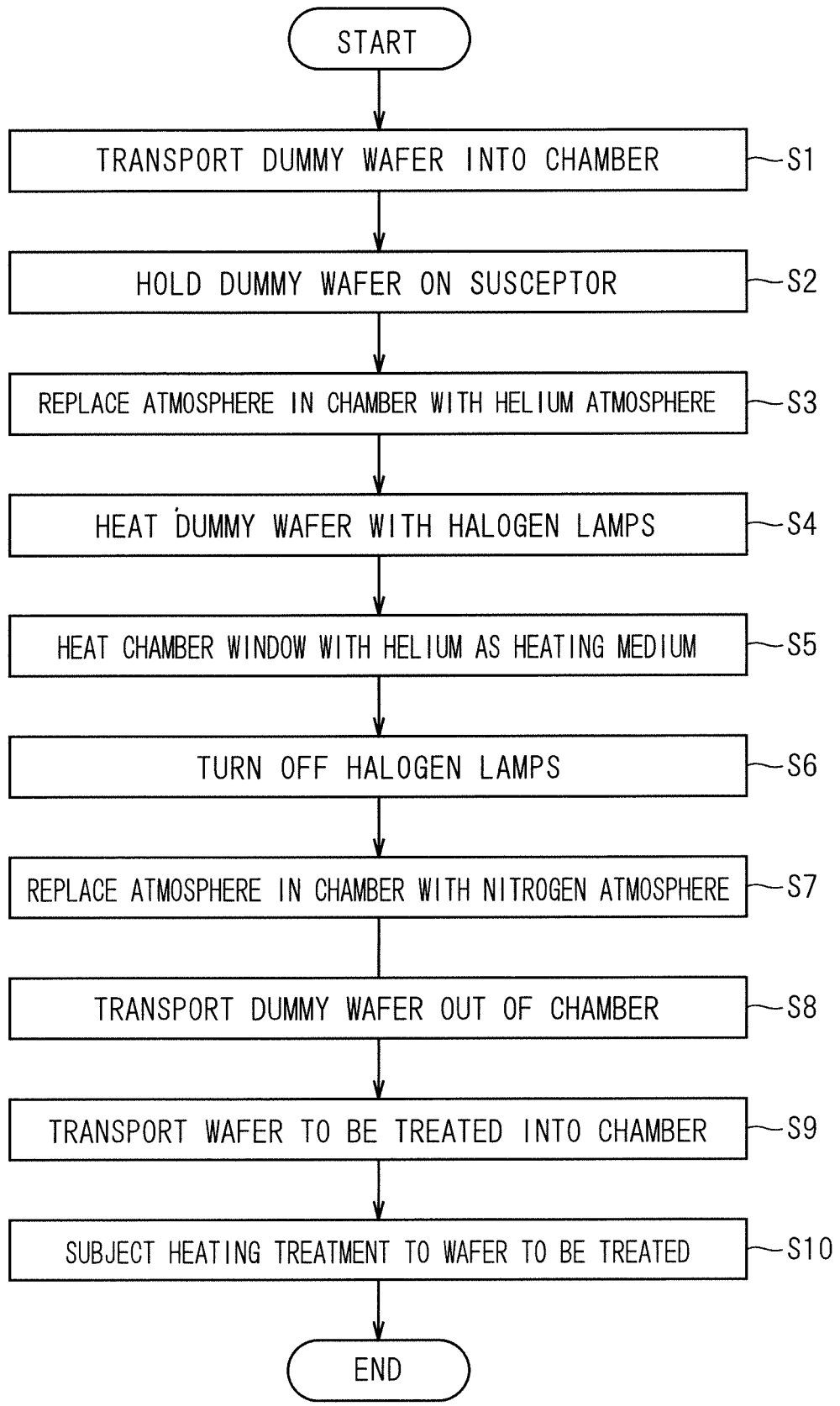

F I G. 9
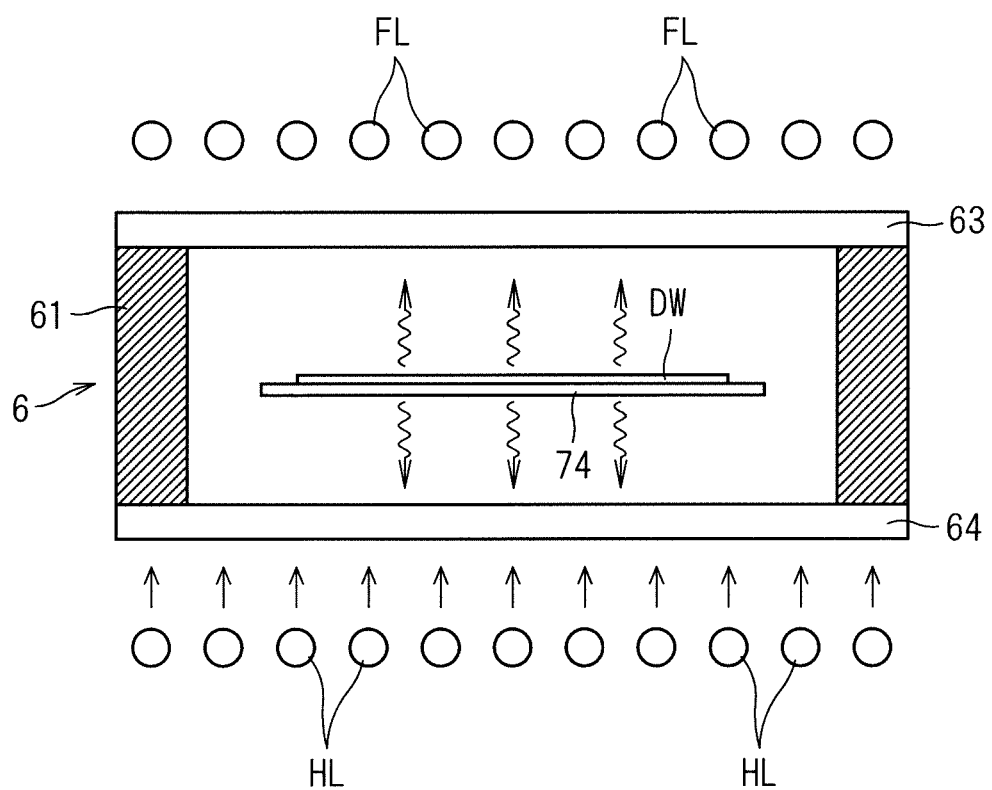

THERMAL PROCESSING METHOD AND THERMAL PROCESSING DEVICE

CROSS-REFERENCE TO RELATED APPLICATIONS

The present application is a 35 U.S.C. §§ 371 national phase conversion of International Application No. PCT/JP2018/037010, filed Oct. 3, 2018, which claims priority to Japanese Patent Application No. 2018-011269, filed Jan. 26, 2018, the contents of both of which are incorporated herein by reference. The PCT International Application was published in the Japanese language.

TECHNICAL FIELD

The present invention relates to a heat treatment method and a heat treatment apparatus which irradiate a thin plate-like precision electronic substrate (hereinafter referred to simply as a "substrate") such as a semiconductor wafer with light to heat the substrate.

BACKGROUND ART

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

A heat treatment apparatus employing such xenon flash lamps is disclosed in, for example, Patent Document 1 in which the flash lamps are disposed on the front surface side of a semiconductor wafer whereas halogen lamps are disposed on the back surface side thereof, so that a desired heat treatment is performed by the combination of the flash lamps and the halogen lamps. In the heat treatment apparatus disclosed in Patent Document 1, the semiconductor wafer is preheated to a certain degree of temperature by the halogen lamps, and the temperature of the front surface of the semiconductor wafer is thereafter increased to a desired treatment temperature by flash irradiation from the flash lamps.

PRIOR ART DOCUMENT

Patent Document

Patent Document 1: Japanese Patent Application Laid-Open No. 2010-225645

SUMMARY

Problem to be Solved by the Invention

In general, not only heat treatment but also processing or treatment of semiconductor wafers is performed lot by lot (a group of semiconductor wafers subjected to the same processing or treatment under the same condition). In a single-wafer type substrate processing apparatus, semiconductor wafers in a lot are processed sequentially in succession. In a flash lamp annealer, semiconductor wafers in a lot are also transported one by one into a chamber and heat-treated sequentially.

When a flash lamp annealer in a nonoperational condition starts treatment of a lot, the first semiconductor wafer in the lot is transported into a chamber that is at approximately room temperature and is then heat-treated. During heating treatment, the semiconductor wafer supported by a susceptor in the chamber is preheated to a predetermined temperature, and the temperature of the front surface of the semiconductor wafer is further increased to a treatment temperature by flash heating. As a result, the semiconductor wafer the temperature of which has increased heats in-chamber structures including the susceptor, a chamber window and the like to increase the temperature of the in-chamber structures. Such an increase in temperature of the in-chamber structures which results from the heating treatment of the semiconductor wafer continues during the treatment of several semiconductor wafers subsequent to the first wafer in the lot. In due time, the temperature of the in-chamber structures reaches a constant stabilized temperature when the heating treatment is performed on approximately ten semiconductor wafers. That is, the first semiconductor wafer in the lot is treated in the chamber that is at room temperature, whereas the tenth and subsequent semiconductor wafers are treated in the chamber the temperature of which is increased to the stabilized temperature.

Thus, there arises a problem that the temperature history of the semiconductor wafers in the lot becomes non-uniform. In particular, there is a danger that the attained surface temperature of several semiconductor wafers subsequent to the first wafer in the lot at the time of the flash irradiation does not reach a treatment temperature because these semiconductor wafers are treated in the chamber that is at a relatively low temperature.

To solve such a problem, it has been conventionally common practice that dummy wafers not to be treated are transported into the chamber and held by the susceptor prior to the start of the treatment of a lot, and preheating and flash heating treatment are performed on the dummy wafers under the same condition as the lot to be treated, whereby the temperature of the in-chamber structures is increased in advance (dummy running). The temperature of the in-chamber structures reaches the stabilized temperature by performing the preheating and the flash heating treatment on approximately ten dummy wafers. Thereafter, the treatment of the first semiconductor wafer in the lot to be treated is started. This makes the temperature history of the semiconductor wafers in the lot uniform.

Unfortunately, such dummy running not only consumes the dummy wafers irrelevant to the treatment but also requires a considerable amount of time for the flash heating treatment of the approximately ten dummy wafers. Thus, the dummy running presents a problem that the efficient operation of the flash lamp annealer is hindered.

The present invention has been made in view of the aforementioned problem, and an object of the present invention is to provide a heat treatment method and a heat treatment apparatus which are capable of omitting dummy running.

Means to Solve the Problem

In order to solve the aforementioned problem, a first aspect according to the present invention is directed to a heat treatment method for heating a substrate by irradiating the substrate with light, including: a light irradiation step of heating a substrate placed on a susceptor in a chamber by irradiating the substrate with light emitted from a continuous lighting lamp; an atmosphere formation step of placing a preheating substrate on the susceptor before transporting a substrate to be treated into the chamber, and forming an atmosphere including a heat transfer gas higher in thermal conductivity than a treatment gas for use in the light irradiation step by supplying the heat transfer gas into the chamber; and a preheating step of heating the preheating substrate by irradiating the preheating substrate with light emitted from the continuous lighting lamp, and increasing a temperature of a quartz window disposed in the chamber by the heat transferred from the preheating substrate with the heat transfer gas.

Also, a second aspect is directed to the heat treatment method according to the first aspect, wherein in the atmosphere formation step, the heated heat transfer gas is supplied into the chamber.

Also, a third aspect is directed to the heat treatment method according to the first aspect, wherein the heat transfer gas is helium.

Also, a fourth aspect is directed to a heat treatment apparatus for heating a substrate by irradiating the substrate with light, including: a chamber for receiving a substrate therein; a susceptor for supporting the substrate in the chamber; a continuous lighting lamp for irradiating the substrate supported by the susceptor with light to heat the substrate; and a gas supply part for supplying a gas into the chamber, wherein a preheating substrate is placed on the susceptor before a substrate to be treated is transported into the chamber, a heat transfer gas higher in thermal conductivity than a treatment gas for use in a heat treatment of the substrate to be treated is supplied from the gas supply part into the chamber to form an atmosphere including the heat transfer gas, and the preheating substrate is heated by irradiating the preheating substrate with light emitted from the continuous lighting lamp to increase a temperature of a quartz window disposed in the chamber by the heat transferred from the preheating substrate with the heat transfer gas.

Also, a fifth aspect is directed to the heat treatment apparatus according to the fourth aspect, further including: a gas heating part for heating the heat transfer gas.

Also, a sixth aspect is directed to the heat treatment apparatus according to the fourth aspect, wherein the heat transfer gas is helium.

Effects of the Invention

With the heat treatment method according to the first to third aspects, the preheating substrate is heated by the light irradiation from the continuous lighting lamp before the substrate to be treated is transported into the chamber, and the temperature of the quartz window disposed in the chamber is increased by the heat transferred from the preheating substrate with the heat transfer gas. Therefore, the temperature of the quartz window is already increased at the time when the substrate to be treated has been transported into the chamber. It is thus possible to omit dummy running.

In particular, with the heat treatment method according to the second aspect, the heated heat transfer gas is supplied into the chamber. It is thus possible to increase the temperature of the quartz window more efficiently.

With the heat treatment apparatus according to the fourth to sixth aspects, the preheating substrate is heated by the light irradiation from the continuous lighting lamp before the substrate to be treated is transported into the chamber, and the temperature of the quartz window disposed in the chamber is increased by the heat transferred from the preheating substrate with the heat transfer gas. Therefore, the temperature of the quartz window is already increased at the time when the substrate to be treated has been transported into the chamber. It is thus possible to omit dummy running.

In particular, the heat treatment apparatus according to the fifth aspect further includes the gas heating part for heating the heat transfer gas. It is thus possible to increase the temperature of the quartz window more efficiently.

BRIEF DESCRIPTION OF DRAWINGS

FIG. 8 is a flowchart showing a procedure of a heat treatment method according to the present invention.

FIG. 9 is a diagram showing a state of a dummy wafer heated in a helium atmosphere.

DESCRIPTION OF EMBODIMENT

A preferred embodiment according to the present invention will now be described in detail with reference to the drawings.

Figure 1:
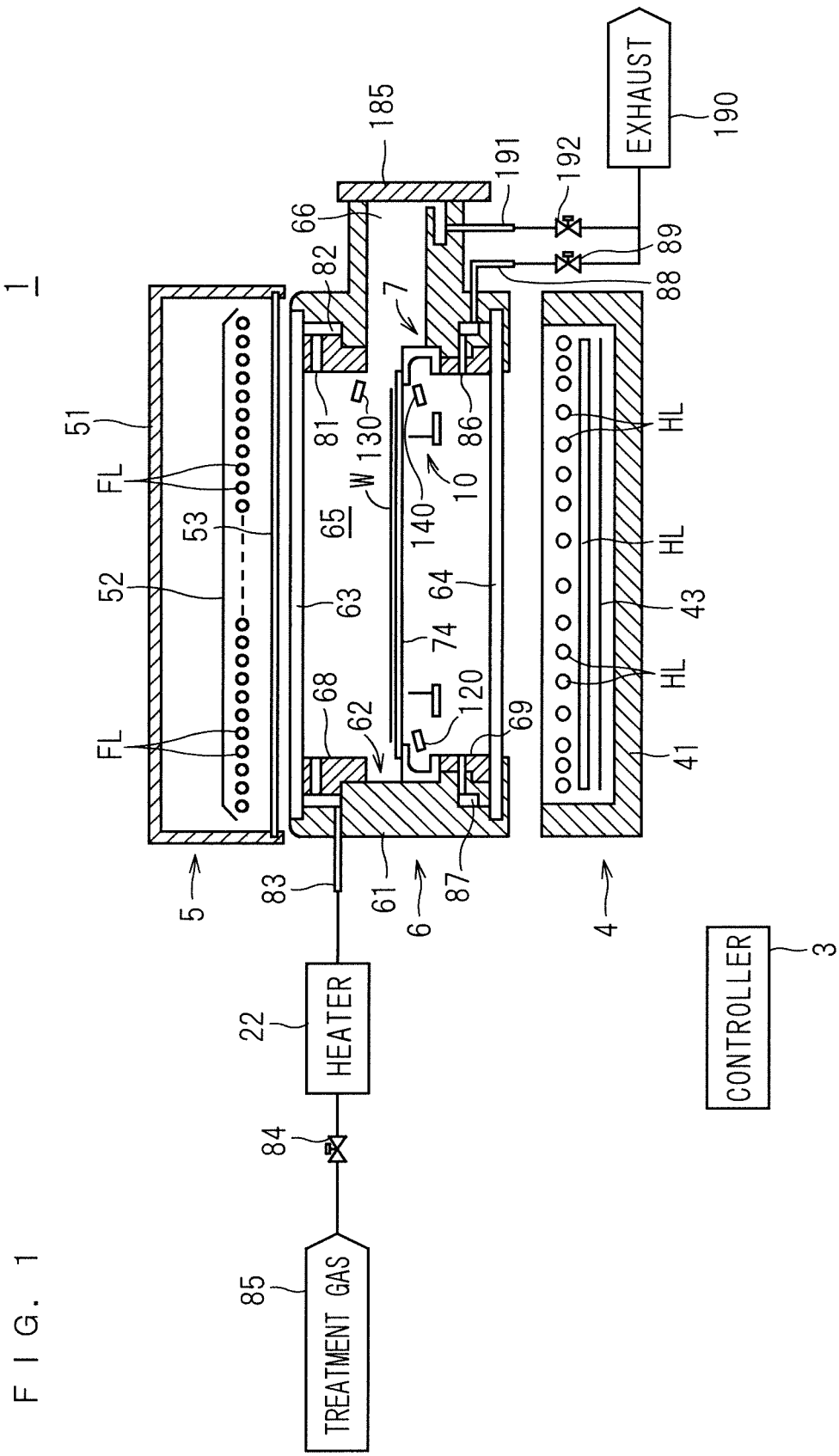
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 in FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5 and the chamber 6 to cause the operating mechanisms to heat-treat a semiconductor wafer W.

The chamber 6 is configured such that chamber windows made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

The chamber 6 according to the present preferred embodiment is compatible with reduced pressure, which is capable of reducing a pressure thereinside to a pressure less than atmospheric pressure. Therefore, the thickness of the upper chamber window 63 and the lower chamber window 64 is greater than that for a chamber compatible with normal pressure for the purpose of enhancing pressure resistance. For example, a normal pressure-compatible chamber window has a thickness of 8 mm. In the present preferred embodiment, on the other hand, the upper chamber window 63 and the lower chamber window 64 have a thickness of 28 mm.

A reflective ring 68 is mounted to an upper portion of the inner wall surface of the chamber side portion 61, and a reflective ring 69 is mounted to a lower portion thereof. Both of the reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the reflective rings 68 and 69 are removably mounted to the chamber side portion 61. An interior space of the chamber 6, i.e. a space surrounded by the upper chamber window 63, the lower chamber window 64, the chamber side portion 61, and the reflective rings 68 and 69, is defined as a heat treatment space 65.

A recessed portion 62 is defined in the inner wall surface of the chamber 6 by mounting the reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the reflective ring 68, and an upper end surface of the reflective ring 69. The recessed portion 62 is provided in the form of a horizontal annular ring in the inner wall surface of the chamber 6, and surrounds the holder 7 which holds a semiconductor wafer W. The chamber side portion 61 and the reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

A gas supply opening 81 for supplying a gas therethrough into the heat treatment space 65 is provided in an upper portion of the inner wall of the chamber 6. The gas supply opening 81 is provided above the recessed portion 62, and may be provided in the reflective ring 68. The gas supply opening 81 is connected in communication with a gas supply pipe 83 through a buffer space 82 provided in the form of an annular ring inside the side wall of the chamber 6. The gas supply pipe 83 is connected to a gas supply source 85. A valve 84 and a heater 22 are inserted at some midpoint in the gas supply pipe 83. The kind of the gas to be supplied from the gas supply source 85 is not particularly limited and selected as appropriate. Examples of the gas include inert gases such as nitrogen ($N_2$), argon (Ar) and helium (He), reactive gases such as oxygen ($O_2$), hydrogen ($H_2$), chlorine ($Cl_2$), hydrogen chloride (HCl), ozone ($O_3$) and ammonia ($NH_3$), and mixtures of these gases.

When the valve 84 is opened, the gas is fed from the gas supply source 85 to the buffer space 82. The gas flowing in the buffer space 82 flows in a spreading manner within the buffer space 82 which is lower in fluid resistance than the gas supply opening 81, and is supplied through the gas supply opening 81 into the heat treatment space 65. That is, the gas supply source 85 and the valve 84 correspond to a gas supply part for supplying a gas into the chamber 6. The heater 22 heats the gas flowing through the gas supply pipe 83. The gas heated by the heater 22 is supplied through the gas supply opening 81 into the heat treatment space 65. That is, the heater 22 corresponds to a gas heating part for heating a gas to be supplied into the chamber 6.

A gas exhaust opening 86 for exhausting a gas from the heat treatment space 65 is provided in a lower portion of the inner wall of the chamber 6. The gas exhaust opening 86 is provided below the recessed portion 62, and may be provided in the reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The gas supply opening 81 and the gas exhaust opening 86 may include a plurality of gas supply openings 81 and a plurality of gas exhaust openings 86, respectively, arranged in a circumferential direction of the chamber 6, and may be in the form of slits.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

The exhaust part 190 to be used herein may be a vacuum pump or an exhaust utility in a factory where the heat treatment apparatus 1 is installed. When a vacuum pump is employed as the exhaust part 190, and the atmosphere is exhausted from the heat treatment space 65 as an enclosed space without supply of gas through the gas supply opening 81 with the valve 84 closed, the interior of the chamber 6 can be decompressed to a vacuum atmosphere. In addition, even when a vacuum pump is not used as the exhaust part 190, the interior of the chamber 6 can be decompressed to a pressure less than atmospheric pressure by exhausting the atmosphere from the chamber 6 without supplying the gas through the gas supply opening 81.

Figure 2:
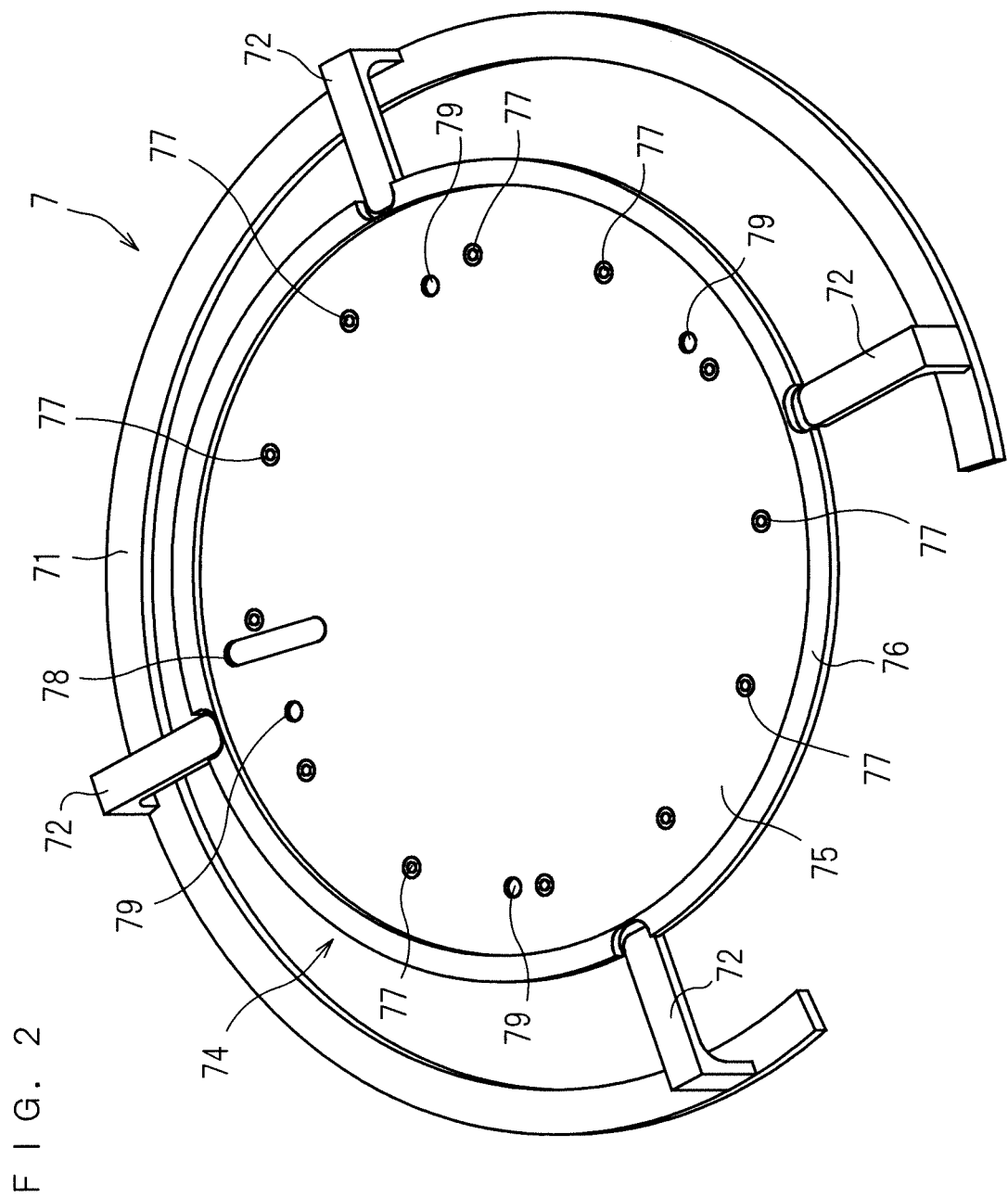
FIG. 2 is a perspective view showing the entire external appearance of a holder.

FIG. 2 is a perspective view showing the entire external appearance of the holder 7. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
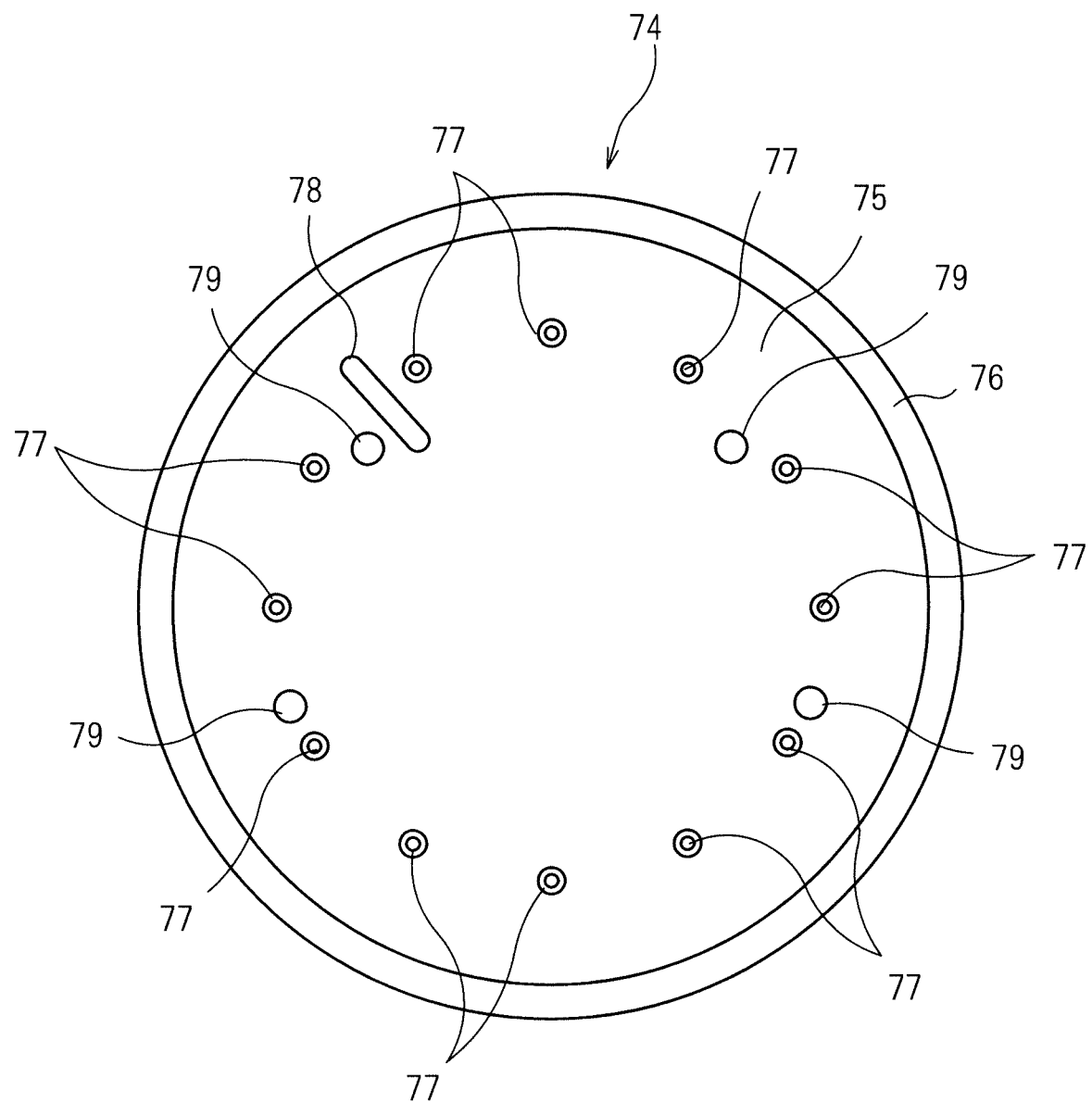
FIG. 3 is a plan view of a susceptor.
Figure 4:
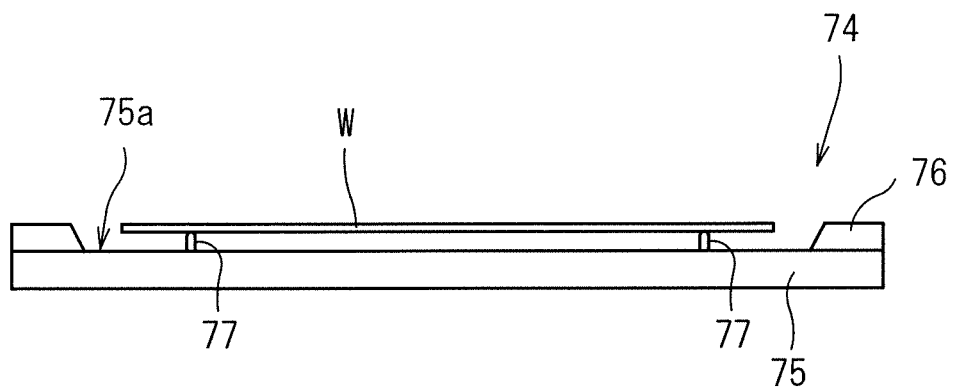
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for a radiation thermometer 120 (with reference to FIG. 1) to receive radiation (infrared radiation) emitted from the lower surface of the semiconductor wafer W. Specifically, the radiation thermometer 120 receives the radiation emitted from the lower surface of the semiconductor wafer W through the opening 78, and a separately placed detector measures the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
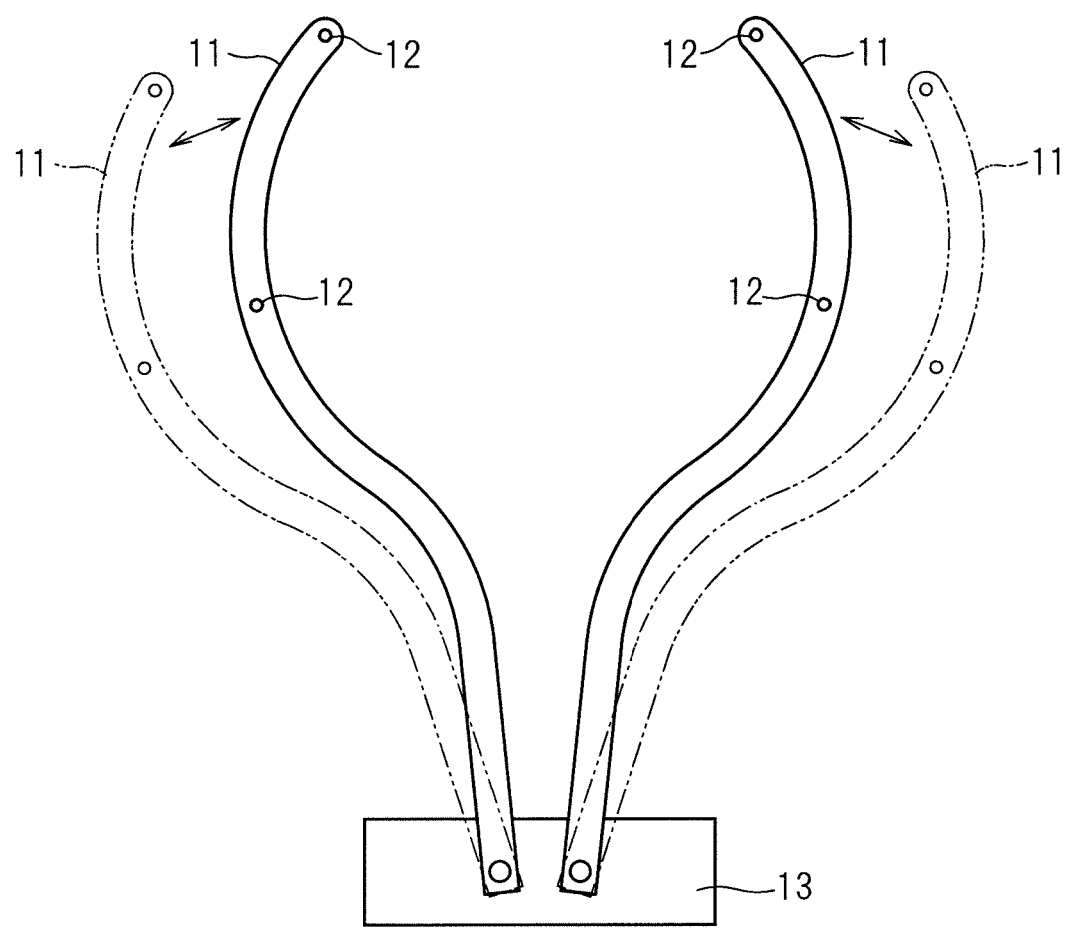
FIG. 5 is a plan view of a transfer mechanism.
Figure 6:
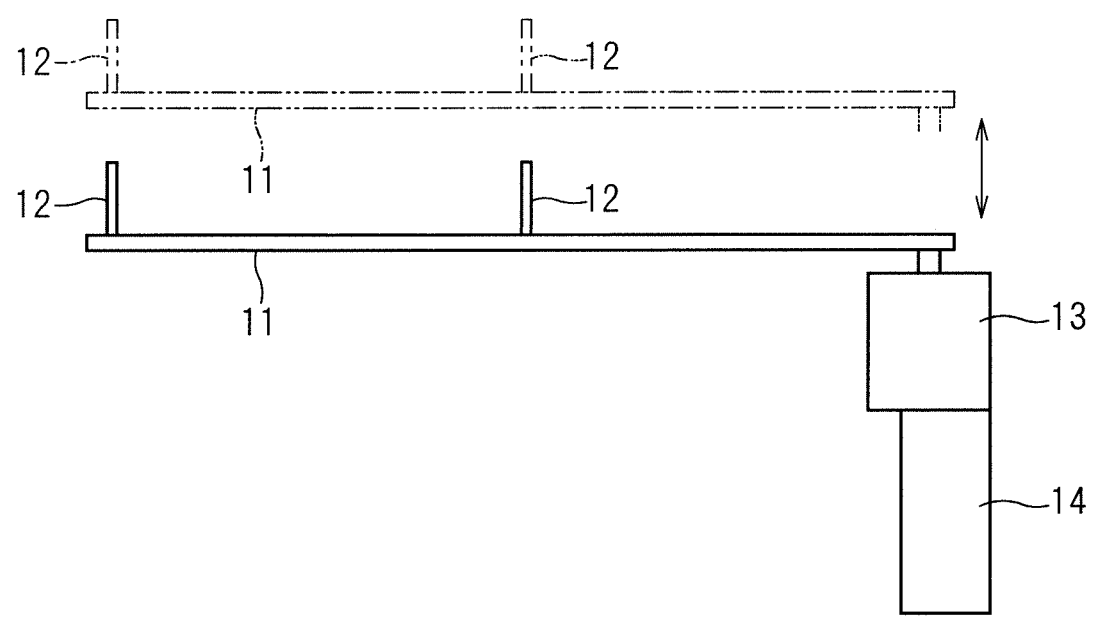
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The pair of transfer arms 11 is moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

As shown in FIG. 1, three radiation thermometers 120, 130 and 140 are provided inside the chamber 6. As mentioned above, the radiation thermometer 120 measures the temperature of the semiconductor wafer W through the opening 78 provided in the susceptor 74. The radiation thermometer 130 senses infrared radiation emitted from the upper chamber window 63 to measure the temperature of the upper chamber window 63. The radiation thermometer 140 senses infrared radiation emitted from the lower chamber window 64 to measure the temperature of the lower chamber window 64.

The flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the plurality of halogen lamps HL. The halogen heating part 4 is provided below the chamber 6, whereby the halogen lamps HL are opposed to the lower chamber window 64.

Figure 7:
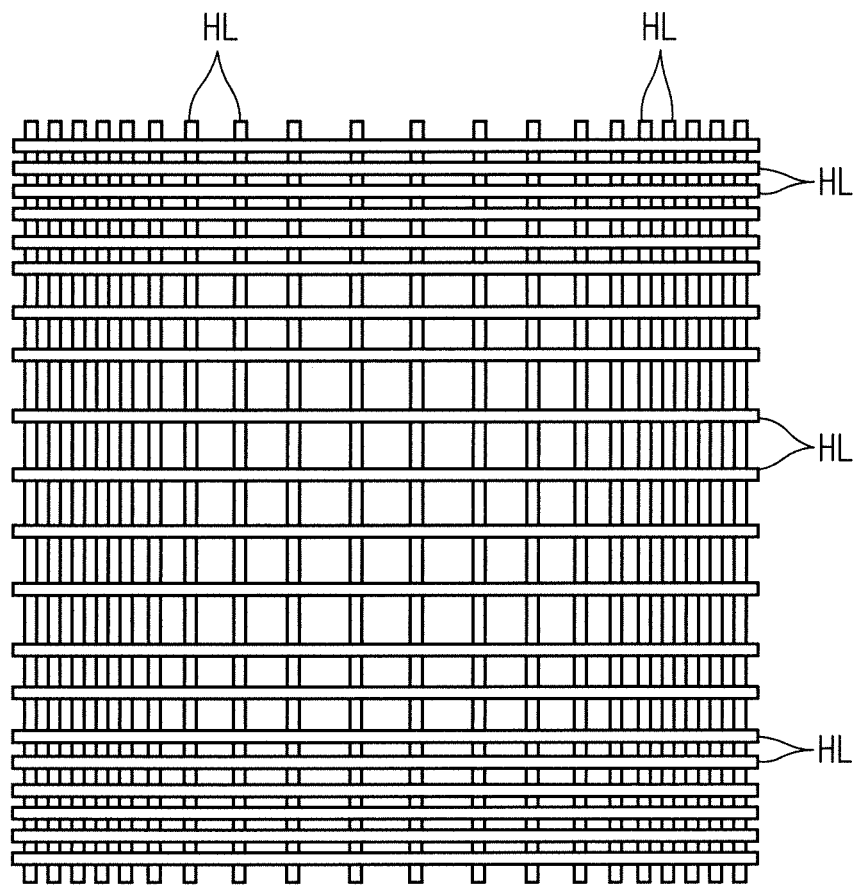
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than at least one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 1 proceed.

Next, a treatment operation in the heat treatment apparatus 1 will be described. First, a normal procedure for the heat treatment of a semiconductor wafer W to be treated will be described. A semiconductor wafer W to be treated herein is a semiconductor substrate doped with impurities (ions) by an ion implantation process. The impurities are activated by the heat treatment apparatus 1 performing the process of heating (annealing) the semiconductor wafer W by means of flash irradiation. The procedure for the treatment of the semiconductor wafer W which will be described below proceeds under the control of the controller 3 over the operating mechanisms of the heat treatment apparatus 1.

First, the valve 84 for supply of gas is opened, and the valves 89 and 192 for exhaust of gas are opened, so that the supply and exhaust of gas into and out of the chamber 6 start. When the valve 84 is opened, nitrogen gas is supplied as a treatment gas through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W to be treated through the transport opening 66 into the heat treatment space 65 of the chamber 6. At this time, there is a danger that an atmosphere outside the heat treatment apparatus 1 is carried into the heat treatment space 65 as the semiconductor wafer W is transported into the heat treatment space 65. However, the nitrogen gas is continuously supplied into the chamber 6. Thus, the nitrogen gas flows outwardly through the transport opening 66 to minimize the outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held from below in a horizontal attitude by the susceptor 74 of the holder 7 made of quartz, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 120 when the halogen lamps HL perform the preheating. Specifically, the radiation thermometer 120 receives infrared radiation emitted from the lower surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 120. The preheating temperature T1 shall be on the order of 200° C. to 800° C., preferably on the order of 350° C. to 600° C., (in the present preferred embodiment, 600° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 120 reaches the preheating temperature T1, the controller 3 adjusts the output from the halogen lamps HL to maintain the temperature of the semiconductor wafer W at approximately the preheating temperature T1.

The flash lamps FL in the flash heating part 5 irradiate the front surface of the semiconductor wafer W held by the susceptor 74 with a flash of light at the point in time when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 milliseconds or more to about 100 milliseconds or less as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2 of 1000° C. or higher. After the impurities implanted in the semiconductor wafer W are activated, the front surface temperature of the semiconductor wafer W decreases rapidly. Because of the capability of increasing and decreasing the front surface temperature of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

After a predetermined time period has elapsed since the completion of the flash heating treatment, the halogen lamps HL turn off. This causes the temperature of the semiconductor wafer W to decrease rapidly from the preheating temperature T1. The radiation thermometer 120 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 120. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

Typically, the treatment of semiconductor wafers W is performed on a lot-by-lot basis. The term "lot" refers to a group of semiconductor wafers W subjected to the same treatment under the same condition. In the heat treatment apparatus 1 according to the present preferred embodiment, multiple (e.g., 25) semiconductor wafers W in a lot are sequentially transported one by one into the chamber 6 and subjected to the heating treatment.

For the start of the treatment of a lot in the heat treatment apparatus 1 that has not performed the treatment for some period of time, the first semiconductor wafer W in the lot is transported into the chamber 6 that is at approximately room temperature and is then subjected to the flash heating treatment. Examples of this case are such that the heat treatment apparatus 1 starts up after maintenance and then treats the first lot and such that a long time period has elapsed since the treatment of the preceding lot. During the heating treatment, heat transfer and heat radiation occur from the semiconductor wafer W increased in temperature to in-chamber structures including the susceptor 74 and the like. For this reason, the temperature of the in-chamber structures that is initially at room temperature increases gradually due to heat storage as the number of treated semiconductor wafers W increases. Also, part of infrared radiation emitted from the halogen lamps HL is absorbed by the lower chamber window 64. For this reason, the temperature of the lower chamber window 64 increases gradually as the number of treated semiconductor wafers W increases.

When the heating treatment is performed on approximately ten semiconductor wafers W, the temperature of the in-chamber structures including the lower chamber window 64 reaches a constant stabilized temperature. In the chamber 6 the temperature of which reaches the stabilized temperature, the amount of heat transferred from the semiconductor wafer W to the in-chamber structures and the amount of heat dissipated from the in-chamber structures are balanced with each other. Before the temperature of the chamber 6 reaches the stabilized temperature, the amount of heat transferred from the semiconductor wafer W to the in-chamber structures is greater than the amount of heat dissipated from the in-chamber structures, so that the temperature of the in-chamber structures increases gradually due to heat storage as the number of treated semiconductor wafers W increases. On the other hand, after the temperature of the chamber 6 reaches the stabilized temperature, the amount of heat transferred from the semiconductor wafer W to the in-chamber structures and the amount of heat dissipated from the in-chamber structures are balanced with each other, so that the temperature of the in-chamber structures is maintained at the constant stabilized temperature. In addition, after the temperature of the lower chamber window 64 reaches the stabilized temperature, the amount of heat absorbed by the lower chamber window 64 from the light emitted from the halogen lamps HL and the amount of heat dissipated from the lower chamber window 64 are balanced with each other. For this reason, the temperature of the lower chamber window 64 is also maintained at the constant stabilized temperature.

Accordingly, if the treatment is started in the chamber 6 that is at room temperature, the temperature of the structures in the chamber 6 differs between initial semiconductor wafers W in the lot and intermediate semiconductor wafers W in the lot. Specifically, the initial semiconductor wafer W in the lot is treated in the chamber 6 that is near room temperature, whereas the tenth and subsequent semiconductor wafers W are treated in the chamber 6 the temperature of which is increased to the stabilized temperature. This causes a problem that a non-uniform temperature history results from a difference in ambient temperature between the initial semiconductor wafers W in the lot and the intermediate semiconductor wafers W in the lot. To solve the problem, prior to the start of the treatment of a lot, dummy running has been hitherto performed which is a conventional technique in which approximately ten dummy wafers not to be treated are sequentially transported into the chamber 6, and the preheating and the flash heating treatment similar to those for the semiconductor wafers W to be treated are performed on the dummy wafers, whereby the temperature of the in-chamber structures including the susceptor 74, the lower chamber window 64 and the like is increased to the stabilized temperature, as already discussed. Such dummy running hinders efficient operation of the heat treatment apparatus 1 as already discussed.

To solve this problem, according to the present preferred embodiment, the in-chamber structures including the lower chamber window 64 and the upper chamber window 63 are preheated in advance before semiconductor wafers W to be treated are transported into the chamber 6. FIG. 8 is a flowchart showing a procedure of a heat treatment method according to the present invention.

First, before the treatment is started in the chamber 6 that is at room temperature, a dummy wafer DW is transported into the chamber 6 (step S1). The dummy wafer DW is a silicon wafer of a disk shape similar to that of a semiconductor wafer W, and has a size and a form similar to those of the semiconductor wafer W. However, the dummy wafer DW is not patterned and is not implanted with ions (so-called a bare wafer).

The procedure of transporting the dummy wafer DW into the chamber 6 is the same as the abovementioned procedure of transporting the semiconductor wafer W into the chamber 6. That is, the transport robot outside the heat treatment apparatus 1 transports the dummy wafer DW into the chamber 6, and the dummy wafer DW is placed on the lift pins 12 of the transfer mechanism 10. Then, when the lift pins 12 move downwardly, the dummy wafer DW is held by the susceptor 74 (step S2). It should be noted that the interior of the chamber 6 is in a nitrogen atmosphere at the time when the dummy wafer DW is transported into the chamber 6.

Next, the atmosphere inside the chamber 6 is replaced with a helium atmosphere (step S3). At this time, the atmosphere is exhausted once from the heat treatment space 65 as an enclosed space without supply of gas through the gas supply opening 81, so that the interior of the chamber 6 is decompressed to a pressure less than atmospheric pressure. Next, the valve 84 is opened with the valve 89 and the valve 192 closed, and a mixture of helium and nitrogen is supplied from the gas supply source 85 into the chamber 6. Thus, an atmosphere including the helium gas is formed in the heat treatment space 65 of the chamber 6. When the interior of the chamber 6 is decompressed once, and then the mixture of helium and nitrogen is supplied into the chamber 6, the nitrogen atmosphere in the chamber 6 can be rapidly replaced with a helium atmosphere.

Next, the 40 halogen lamps HL turn on and emit light onto the dummy wafer DW to heat the dummy wafer DW (step S4). Light emitted from the halogen lamps HL is transmitted through the lower chamber window 64 and the susceptor 74 both made of quartz, and impinges upon the lower surface of the dummy wafer DW. By receiving light irradiation from the halogen lamps HL, the dummy wafer DW is heated, so that the temperature thereof increases.

FIG. 9 is a diagram showing a state of the dummy wafer DW heated in the helium atmosphere. The helium gas is higher in thermal conductivity than a nitrogen gas which is the treatment gas for use in the heat treatment of the semiconductor wafer W. The nitrogen gas has a thermal conductivity of 0.024 W/mK at 0° C., whereas the helium gas has a thermal conductivity of 0.144 W/mK at 0° C. The helium gas having such a high thermal conductivity serves as a heat transfer gas. When the temperature of the dummy wafer DW increases in the atmosphere including the helium gas, heat transfer from the dummy wafer DW to the structures in the chamber 6 occurs with the helium gas as the heating medium. Thus, the upper chamber window 63 and the lower chamber window 64 in the chamber 6 are heated (step S5). The susceptor 74 is also heated by the heat transfer and heat radiation from the dummy wafer DW the temperature of which has increased.

At this time, the structures in the chamber 6 are heated by the dummy wafer DW so that the temperature of the upper chamber window 63 and the lower chamber window 64 reaches the stabilized temperature. The stabilized temperature of the upper chamber window 63 and the lower chamber window 64 refers to a temperature of the upper chamber window 63 and the lower chamber window 64 at the time when the upper chamber window 63 and the lower chamber window 64 reach a stable state in which the temperature thereof increases and becomes constant after the heating treatment is continuously performed on 10 or more semiconductor wafers W in the lot. Specifically, an output from the halogen lamps HL capable of heating the dummy wafer DW to the temperature required for increasing the temperature of the upper chamber window 63 and the lower chamber window 64 to the stabilized temperature is previously obtained by experiment or simulation, and the obtained output is set in the controller 3. Under the control of the controller 3, then, the output from the halogen lamps HL is adjusted to the set output. As a result, the dummy wafer DW is heated to the predetermined temperature by the light irradiation from the halogen lamps HL, and the temperature of the upper chamber window 63 and the lower chamber window 64 is increased to the stabilized temperature by the heat transfer from the dummy wafer DW with the helium gas as a heating medium. Alternatively, the controller 3 may effect feedback control of the output from the halogen lamps HL so that the temperature of the upper chamber window 63 and the lower chamber window 64 is equal to the stabilized temperature, based on measured values measured with the radiation thermometers 130 and 140.

After the temperature of the upper chamber window 63 and the lower chamber window 64 is increased to the stabilized temperature by the heat transfer from the dummy wafer DW, the 40 halogen lamps HL turn off (step S6). When the halogen lamps HL turn off, the temperature of the dummy wafer DW decreases, but the temperature of the quartz members, such as the upper chamber window 63, the lower chamber window 64 and the susceptor 74, having large heat capacity does not immediately decrease and is maintained at substantially the stabilized temperature.

Next, the atmosphere inside the chamber 6 is replaced with a nitrogen atmosphere (step S7). As in a manner similar to the aforementioned atmosphere replacement with the helium atmosphere, when the interior of the chamber 6 is decompressed once to a pressure less than atmospheric pressure, and then the nitrogen gas is supplied into the chamber 6, the helium atmosphere in the chamber 6 is rapidly replaced with the nitrogen atmosphere.

Next, the dummy wafer DW is transported out of the chamber 6 (step S8). The procedure of transporting the dummy wafer DW out of the chamber 6 is also the same as the abovementioned procedure of transporting the semiconductor wafer W out of the chamber 6. That is, the lift pins 12 move upwardly to receive the dummy wafer DW from the susceptor 74, and the transport robot outside the heat treatment apparatus 1 transports the dummy wafer DW out of the chamber 6.

After the dummy wafer DW is transported out of the chamber 6, the semiconductor wafer W to be treated first in the lot is immediately transported into the chamber 6 and held on the susceptor 74 (step S9). Then, the heating treatment is performed on the semiconductor wafer W to be treated, in accordance with the aforementioned procedure for the treatment (step S10).

In the present preferred embodiment, before the start of the treatment of a semiconductor wafer W to be treated first in the lot, the dummy wafer DW is transported into the chamber 6 and placed on the susceptor 74, and the helium gas higher in thermal conductivity than the nitrogen gas is supplied into the chamber 6 to form the atmosphere including the helium gas. Then, when the dummy wafer DW is heated in the atmosphere including the helium gas by the light irradiation from the halogen lamps HL, the heat transfer from the dummy wafer DW the temperature of which has increased occurs at the structures in the chamber 6, including the upper chamber window 63 and the lower chamber window 64, with the helium gas as the heating medium. In particular, when the atmosphere in the chamber 6 is set at the atmosphere including helium gas having high thermal conductivity, the heat from the dummy wafer DW can be efficiently transferred to the structures in the chamber 6 including the upper chamber window 63 and the lower chamber window 64.

The heat is transferred from the dummy wafer DW to the structures in the chamber 6, including the upper chamber window 63 and the lower chamber window 64, with the helium gas to increase the temperature of the structures. Thus, when the semiconductor wafer W to be treated first in the lot is transported into the chamber 6, the upper chamber window 63 and the lower chamber window 64 are heated to the stabilized temperature. Therefore, the upper chamber window 63 and the lower chamber window 64 are maintained at the uniform temperature (stabilized temperature) for all the semiconductor wafers W in the lot, and the temperature history can be made uniform. As a result, it is possible to omit dummy running that performs, on multiple (10 or more) dummy wafers, the conventional heating treatment similar to that for an actual semiconductor wafer W. It is therefore possible to reduce time for the in-chamber structures reaching the stabilized temperature and to efficiently operate the heat treatment apparatus 1.

While the preferred embodiment according to the present invention has been described hereinabove, various modifications of the present invention in addition to those described above may be made without departing from the scope and spirit of the invention. For example, in the aforementioned preferred embodiment, the helium gas is used as the heat transfer gas transferring the heat of the dummy wafer DW to the upper chamber window 63 and the lower chamber window 64. The present invention, however, is not limited to this. The heat transfer gas may be a gas higher in thermal conductivity than the nitrogen gas used as the treatment gas for the heat treatment of the semiconductor wafer W to be treated. For example, a hydrogen gas may be used (the thermal conductivity is 0.168 W/mK at 0° C.).

Alternatively, a heat transfer gas containing a mixture of multiple kinds of gases may be supplied into the chamber 6.

In this case, preferably, a mass flow controller or the like may be used for changing a mixing ratio of the heat transfer gas.

Alternatively, a heat transfer gas such as a helium gas may be heated by the heater 22 and supplied into the chamber 6. When the heated heat transfer gas is supplied into the chamber 6, the temperature of the structures in the chamber 6 including the upper chamber window 63 and the lower chamber window 64 can be increased more efficiently.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiment, the filament-type halogen lamps HL are used as continuous lighting lamps that emit light continuously for not less than one second to preheat a semiconductor wafer W. The present invention, however, is not limited to this. In place of the halogen lamps HL, discharge type arc lamps (e.g., xenon arc lamps) may be used as the continuous lighting lamps for preheating. In this case, the discharge type arc lamps are used for heating a dummy wafer DW at the time of preheating.

Moreover, a substrate to be treated by the heat treatment apparatus 1 is not limited to a semiconductor wafer, but may be a glass substrate for use in a flat panel display for a liquid crystal display apparatus and the like, and a substrate for a solar cell. Also, the technique according to the present invention may be applied to the heat treatment of high dielectric constant gate insulator films (high-k films), to the joining of metal and silicon, and to the crystallization of polysilicon.

Further, the heat treatment technique according to the present invention is not limited to the flash lamp annealer, but may be applied to apparatuses including heat sources other than flash lamps such as single-wafer type lamp annealers employing halogen lamps or CVD apparatuses. In particular, the technique according to the present invention is excellently applicable to a backside annealer which performs heat treatment by irradiating the back surface of a semiconductor wafer with light from halogen lamps disposed under a chamber.

EXPLANATION OF REFERENCE SIGNS

1: heat treatment apparatus
3: controller
4: halogen heating part
5: flash heating part
6: chamber
7: holder
10: transfer mechanism
22: heater
63: upper chamber window
64: lower chamber window
65: heat treatment space
74: susceptor
84: valve
85: gas supply source
120, 130, 140: radiation thermometer
DW: dummy wafer
FL: flash lamp
HL: halogen lamp
W: semiconductor wafer

The invention claimed is:

1. A heat treatment method for heating a substrate by irradiating the substrate with light, comprising:
   a light irradiation step of heating a substrate placed on a susceptor in a chamber by irradiating the substrate with light emitted from a continuous lighting lamp;
   an atmosphere formation step of placing a preheating substrate on said susceptor before transporting said substrate to be treated into said chamber, and forming an atmosphere including a heat transfer gas higher in thermal conductivity than a treatment gas for use in said light irradiation step by supplying said heat transfer gas into said chamber; and
   a preheating step of heating said preheating substrate by irradiating said preheating substrate with light emitted from said continuous lighting lamp, and increasing a temperature of a quartz window disposed in said chamber by the heat transferred from said preheating substrate with said heat transfer gas.

2. The heat treatment method according to claim 1, wherein
   in said atmosphere formation step, said heated heat transfer gas is supplied into said chamber.

3. The heat treatment method according to claim 1, wherein
   said heat transfer gas is helium.

4. A heat treatment apparatus for heating a substrate by irradiating the substrate with light, comprising:
   a chamber for receiving a substrate therein;
   a susceptor for supporting the substrate in said chamber;
   a continuous lighting lamp for irradiating the substrate supported by said susceptor with light to heat the substrate;
   a gas supply part for supplying a gas into said chamber; and
   a controller for controlling said apparatus including said continuous lighting lamp and said gas supply part;
   wherein said controller is configured to cause a preheating substrate to be placed on said susceptor before a substrate to be treated is transported into said chamber, said controller being further configured to cause a heat transfer gas higher in thermal conductivity than a treatment gas for use in a heat treatment of said substrate to be treated to be supplied from said gas supply part into said chamber to form an atmosphere including said heat transfer gas, and to cause said preheating substrate to be heated by irradiating said preheating substrate with light emitted from said continuous lighting lamp to increase a temperature of a quartz window disposed in said chamber by the heat transferred from said preheating substrate with said heat transfer gas.

5. The heat treatment apparatus according to claim 4, further comprising:
   a gas heating part for heating said heat transfer gas.

6. The heat treatment apparatus according to claim 4, wherein
   said heat transfer gas is helium.

* * * * *